United States Patent
Osaki et al.

(10) Patent No.: US 9,240,565 B2
(45) Date of Patent: Jan. 19, 2016

(54) COMPOSITION

(71) Applicant: TOYO GOSEI CO., LTD., Inzai-shi, Chiba (JP)

(72) Inventors: Takeshi Osaki, Inzai (JP); Kana Naruse, Inzai (JP); Takashi Miyazawa, Inzai (JP)

(73) Assignee: Toyo Gosei Co., Ltd., Ichikawa-Shi, Chiba (JP)

( * ) Notice: Subject to any disclaimer, the term of this patent is extended or adjusted under 35 U.S.C. 154(b) by 0 days.

(21) Appl. No.: 14/297,488

(22) Filed: Jun. 5, 2014

(65) Prior Publication Data
US 2014/0361275 A1  Dec. 11, 2014

Related U.S. Application Data

(60) Provisional application No. 61/832,086, filed on Jun. 6, 2013.

(51) Int. Cl.
*C08L 83/04* (2006.01)
*H01L 51/52* (2006.01)

(52) U.S. Cl.
CPC ........ *H01L 51/5237* (2013.01); *H01L 51/5253* (2013.01)

(58) Field of Classification Search
CPC ...... C08L 83/04; C08L 77/18; H01L 51/5237
See application file for complete search history.

(56) References Cited

U.S. PATENT DOCUMENTS

| | | | |
|---|---|---|---|
| 2004/0143062 A1* | 7/2004 | Satsu et al. | 525/100 |
| 2004/0265737 A1* | 12/2004 | Hanamura et al. | 430/270.1 |
| 2011/0245371 A1* | 10/2011 | Schweitzer et al. | 523/157 |

* cited by examiner

*Primary Examiner* — Thomas L Dickey
(74) *Attorney, Agent, or Firm* — TraskBritt, P.C.

(57) ABSTRACT

A suitable composition for manufacturing components and devices is disclosed.

21 Claims, 2 Drawing Sheets

COMPOSITION

CROSS-REFERENCE TO RELATED APPLICATION

This application claims the benefit under 35 U.S.C. §119(e) of U.S. Provisional Patent Application Ser. No. 61/832,086, filed on Jun. 6, 2013, the disclosure of which is hereby incorporated herein in its entirety by this reference.

TECHNICAL FIELD

Several aspects of the present invention relates to the field of composition suitable for manufacturing optical or electronic components and devices.

BACKGROUND

Optical materials for radically curable compositions suitable for cast molding are disclosed in JP 2004-2702A (laid-open disclosure date: Jan. 8, 2004), the contents of the entirety of which are incorporated herein by this reference.

BRIEF SUMMARY

A composition is disclosed in the disclosure. The resin formed from such composition can be utilized as sealant, optical component, and electronic component. The resin can suppress generation of free acid in addition to high adhesiveness to a substrate. A typical substrate is made of inorganic materials such as silicon oxide and silicon. Therefore, the resin can be very suitable for electronic devices because of suppression of deterioration of metal wirings by free acid.

A composition relating to an aspect of the present invention includes: a first compound that includes an acidic group and a first polymerizable group; and a second compound that includes a silicon atom, an oxygen atom bonded to the silicon atom, a hydrocarbon group bonded to the oxygen atom, and a second polymerizable group. This enables to suppress diffusion of acid because the acid source can be substantially fixed.

With regard to the composition, it is preferred that the composition further includes a third compound that contains a third polymerizable group.

With regard to the composition, it is preferred that the third compound further has a fourth polymerizable group.

With regard to the composition, it is preferred that the composition further includes: a fourth compound that includes a bond to cleave by an irradiation of the fourth compound.

With regard to the composition, it is preferred that the second compound is a silane-coupling reagent.

With regard to the composition, it is preferred that the first compound further includes a fifth polymerizable group.

A method for manufacturing a component relating an aspect of the present invention, the method includes: providing a member; disposing a composition on the member; and curing the composition.

With regard to the method, it is preferred that the composition includes:
a first compound that includes an acidic group and a first polymerizable group; and a second compound that includes a silicon atom, an oxygen atom bonded to the silicon atom, a hydrocarbon group bonded to the oxygen atom, and a second polymerizable group.

With regard to the composition, it is preferred that the member includes an inorganic portion and the disposing of the composition is carried out such that the composition contacts the inorganic portion.

With regard to the composition, it is preferred that the inorganic portion is constituted by silicon oxide or silicon.

With regard to the composition, it is preferred that the curing of the composition is carried out such that the composition is sandwiched between the member and a mold. With regard to the composition, the mold is characterized that: the mold includes: a first surface where a plurality of first portions and a plurality of second portions are formed; and a second surface, a first distance between the plurality of first portions and the second surface is greater than a second distance between the plurality of second portions and the second surface.

A method for manufacturing a component relating to an aspect of the present invention includes: providing a member; disposing a composition on the member; curing the composition. With regard to the method, it is preferred that the composition includes: a first compound that includes an acidic group and a first polymerizable group; and a second compound that includes a silicon atom, an oxygen atom bonded to the silicon atom, a hydrocarbon group bonded to the oxygen atom, and a second polymerizable group.

A component relating to an aspect of the present invention includes an inorganic portion; an organic portion that includes a first polymer containing an acidic group.

With regard to the component, it is preferred that the organic portion includes a plurality of silicon atoms each of which is bonded to a carbon atom.

With regard to the component, it is preferred that each of the plurality of silicon atoms is bonded to an oxygen atom included in the inorganic portion.

With regard to the component, it is preferred that each of the plurality of silicon atoms is covalently-bonded to an oxygen atom included in the inorganic portion.

A method for manufacturing a device relating to an aspect of the present invention includes: manufacturing the above component.

With regard to the method, it is preferred that the method further includes: forming a first functional layer in which a metal portion is formed.

With regard to the method, it is preferred that the method further includes: forming a second functional layer in which a semiconductor film is formed.

With regard to the method, it is preferred that the device is an electro-optical device.

With regard to the method, it is preferred that the method further includes: forming a first functional layer in which a metal wire is formed; forming a second functional layer in which a semiconductor film is formed. It is preferred that the metal wire is electrically connected to the semiconductor film in the device.

BRIEF DESCRIPTION OF THE DRAWINGS

In the drawings, which illustrate what is currently considered to be the best mode for carrying out the invention.

DETAILED DESCRIPTION

Exemplified Embodiment

Figure 1:
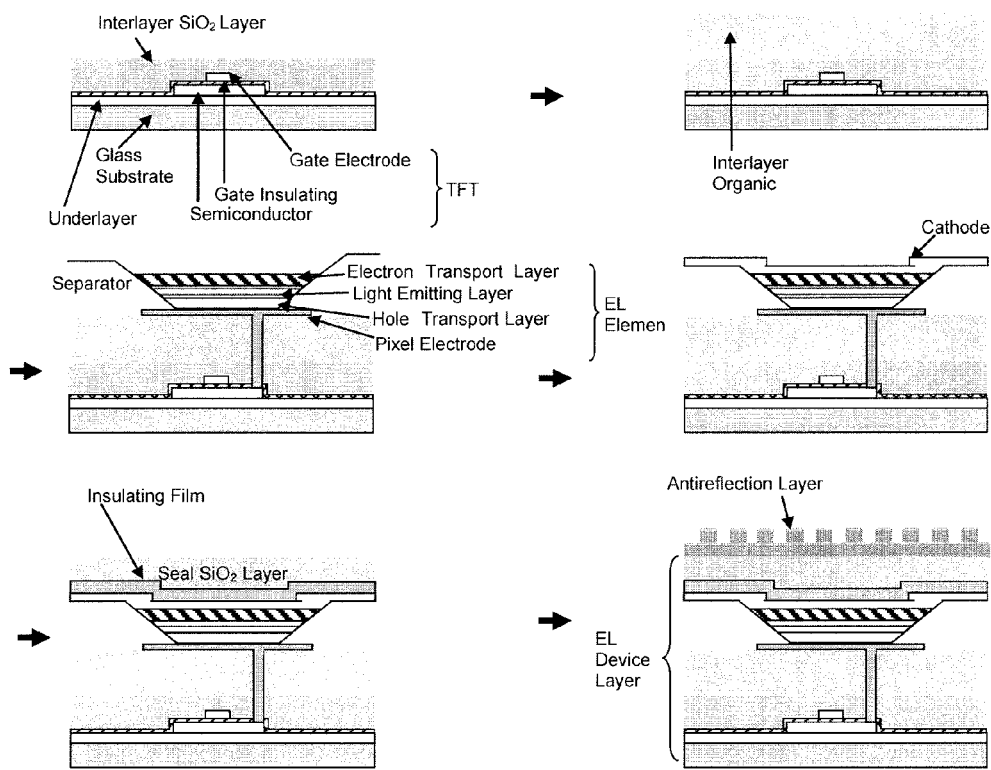
FIG. 1 shows the processes for manufacturing an organic electroluminescent device.
Figure 2:
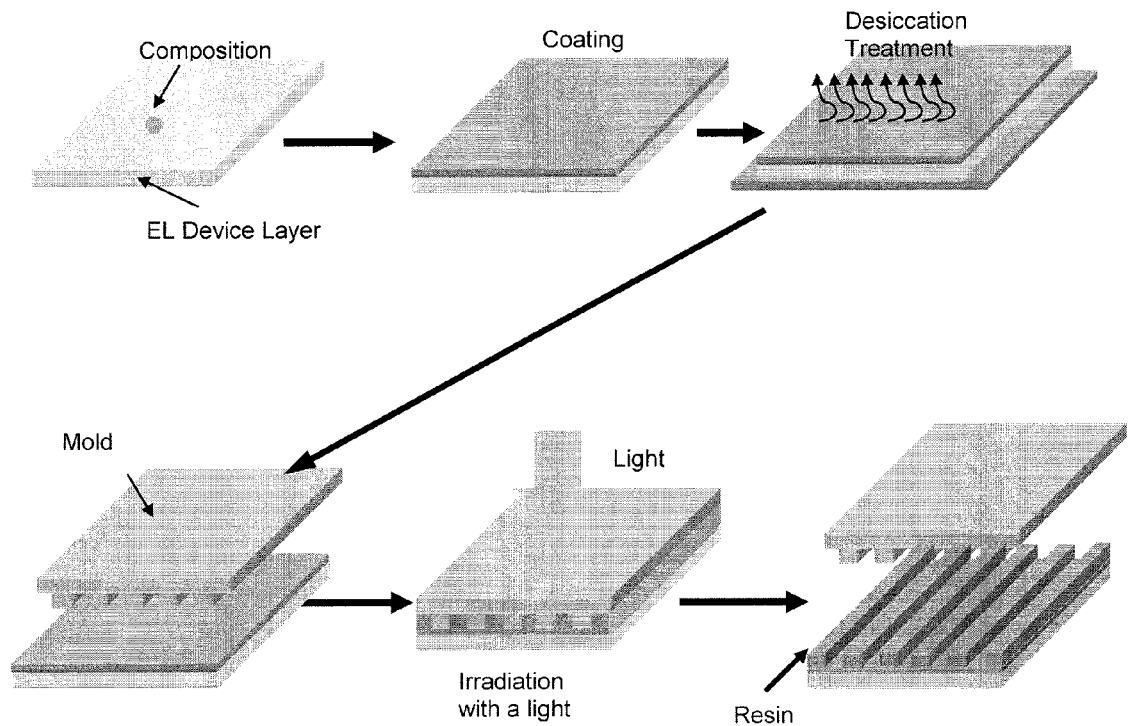
FIG. 2 shows the detail of formation of the antireflection layer.

FIG. 1 shows the processes for manufacturing an organic electroluminescent device.

A glass substrate is provided. An underlayer is formed on the whole surface of the glass substrate. An island-shaped semiconductor layer is formed on the underlayer. A gate insulating film is formed such that the gate insulating film covers the semiconductor layer. A gate electrode is formed on the gate insulating film. An interlayer $SiO_2$ layer is formed such that the interlayer $SiO_2$ layer covers the gate insulating film and the gate electrode.

The underlayer is used for preventing impurities such as sodium ions or the like from diffusing from the glass substrate into the semiconductor layer.

An acrylic film is formed as an interlayer organic layer on the interlayer $SiO_2$ layer. A pixel electrode is formed on the interlayer organic layer.

An organic insulating film is formed as a separator. A hole transport layer, an light emitting layer, and an electron transport layer are formed on the pixel electrode in that order such that those layers are surrounded by the separator.

A cathode is formed on the electron transport layer and the separator.

A seal $SiO_2$ layer and an insulating film are formed on the cathode in that order.

A resin layer is formed as an antireflection layer by nanoimprint technology.

The formation of the antireflection layer is described in detail below.

A composition for forming the antireflection layer is placed on a surface of EL Device Layer and a coating film is formed by spreading the composition over the surface of EL Device Layer.

The coating film is subjected to a desiccation treatment. A concavo-convex surface of a quartz mold is pressed to the coating film against the substrate. An irradiation of the coating film with a light transmitted through the quartz mold forms the antireflection layer of which surface has a concavo-convex pattern transferred from the quartz mold.

The antireflection layer is released from the quartz mold.

The composition contains Constituent A, Constituent B, Constituent C, Constituent D, and Constituent E. The contents of the constituents are 19.9%, 75.8%, 0.2%, 0.1%, and 4.0% by weight, respectively.

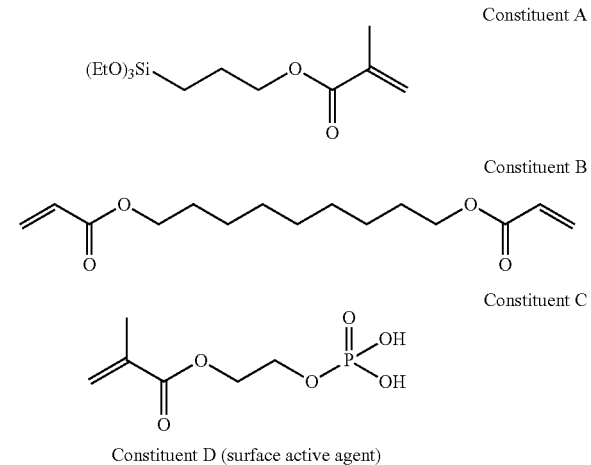

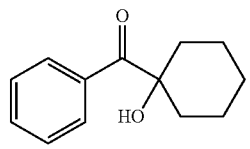

Constituent A serves as a silane coupling reagent. Oxygen atoms bonded to silicon atom is bonded to the surface of the EL Device Layer by a reaction accompanied with elimination of alcohol molecules and catalyzed by acid. Constituent A makes a contribution high adhesiveness of the antireflection layer to EL Device Layer.

Polymerization of Constituent B provides the main portion of the antireflection layer. Monomer having plural polymerizable substituents like Constituent B is preferable for the antireflection layer since crosslink density of the antireflection layer increases in proportion as the number of polymerizable substituents.

Constituent C serves as acid and catalyzes the alcohol-elimination reaction. Since Constituent C has a polymerizable substituent, its polymerization and/or reaction with another constituent occur. This results in fixation of acid in the antireflection layer and prevents acid from spreading out from the antireflection layer. Instead of Constituent C, a compound having a plurality of polymerizable groups in addition to acidic group can be utilized.

Even if EL Device Layer contains a metal part such as wring and electrode, the deterioration of EL Device Layer is suppressed by prevention of acid diffusion.

Experimental Procedures for estimations are outlined below:

Estimation of Adhesiveness Between Resin and Substrate

A coating film of a composition is disposed on an alkali-free substrate having 0.7 mm such that the thickness of the coating film is around 2 μm. After the substrate is heated at around 110 degrees Celsius for 5 minutes, the coating film is exposed to a light of which wavelength and intensity are 365 nm and 20 mW/cm², respectively, for 50 seconds to form a resin. According to JISK5400 of JIS, 100 squares are formed in the resin by scratching the resin with a cutter. After appressing a tape against the resin in which the 100 squares have been formed, the tape is pulled toward the opposite side of the resin. It is recognized that the resin is not peeled from the alkali-free substrate.

Estimation for Demolding Ability of Resin

A coating film of a composition is disposed on an alkali-free substrate having 0.7 mm such that the thickness of the coating film is around 2 μm. After the substrate is heated at 110 degrees Celsius for 5 minutes, the coating film is exposed to a light of which wavelength and intensity are 365 nm and 20 mW/cm² for 50 seconds, respectively, to form a resin with a quartz mold of which surface has a line and space pattern with width of 1 μm and height of 1 μm pressed against the coating film. The resin is peeled from the quartz mold. It is recognized that the resin is attached completely to the alkali-free substrate after the resin is peeled from the quartz mold.

Estimation for Transferring Ability of Resin

A coating film of a composition is disposed on an alkali-free substrate having 0.7 mm such that the thickness of the coating film is around 2 μm. After the substrate is heated at around 110 degrees Celsius for 5 minutes, the coating film is exposed to a light of which wavelength and intensity are 365 nm and 20 mW/cm² for 50 seconds, respectively, to form a resin with a quartz mold of which surface has a line and space pattern with width of 500 nm and height of 1 μm pressed against the coating film. The resin is peeled from the quartz mold. It is recognized that the pattern of the quartz mold is transferred to the resin.

Chemical structures of exemplified constituents which can be applied to the composition and composition ratio are outlined below.

Typical constituents of an exemplified composition are as follows:

Constituent A Represented by Chemical Formula I

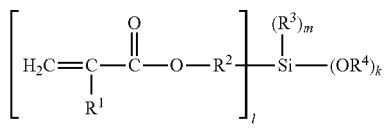

(wherein:
$R^1$ independently represents a hydrogen atom, a liner or cyclic alkyl group;
$R^2$ independently represents a liner or cyclic alkylene group;
$R^3$ independently represents an aryl group, a liner or cyclic alkylene group;
$R^4$ independently represents an aryl group, a liner or cyclic alkylene group;
k represents a natural number from one to three; and
m represents an integer from zero to two.);

Constituent B which is a compound having at least one racial polymerization group;

Constituent C Represented by Chemical Formula II or Formula III

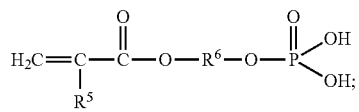

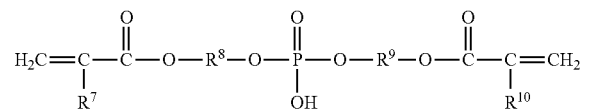

(wherein:
$R^5$ independently represents a hydrogen atom, a liner or cyclic alkyl group;
$R^6$ independently represents a liner or cyclic alkylene group;
$R^7$ independently represents a hydrogen atom, a liner or cyclic alkyl group;
$R^8$ independently represents a liner or cyclic alkylene group; and
$R^9$ independently represents a liner or cyclic alkylene group.);
$R^{10}$ independently represents a hydrogen atom, a liner or cyclic alkyl group;

Constituent D which a surface active agent such as F-554 the made by DIC Corporation; and Constituent E which is to form a radical by exposure of Constituent E to a light.

A typical composition ratio of the constituents are 0.1%-50% (preferably, 1%-30%); 46%-95.9%; 0.01%-10% (preferably, 0.05%-5%); 0.01%-5%; and 0.1%-10% for Constituents A, B, C, D and E, respectively.

What is claimed is:
1. A composition, comprising:
a first compound represented by Formula II or Formula III,

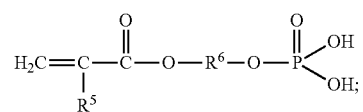

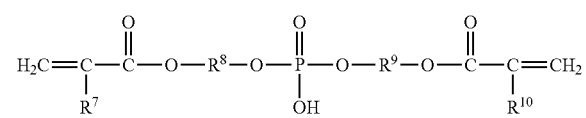

wherein $R^5$ independently represents a hydrogen atom, a linear alkyl group, or a cyclic alkyl group,
$R^6$ independently represents a linear alkylene group or a cyclic alkylene group,
$R^7$ independently represents a hydrogen atom, a linear alkyl group, or a cyclic alkyl group,
$R^8$ independently represents a linear alkylene group or a cyclic alkylene group,
$R^9$ independently represents a linear alkylene group or a cyclic alkylene group, and
$R^{10}$ independently represents a hydrogen atom, a linear alkyl group, or a cyclic alkyl group;
a second compound represented by Formula I,

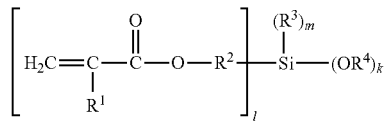

where $R^1$ independently represents a hydrogen atom, a linear alkyl group, or a cyclic alkyl group,
$R^2$ independently represents a linear alkylene group or a cyclic alkylene group,
$R^3$ independently represents an aryl group, a linear alkyl group, or a cyclic alkyl group,
$R^4$ independently represents an aryl group, a linear alkyl group, or a cyclic alkyl group,
k represents a natural number from one to three, and
m represents an integer from zero to two; and
a third compound including a third polymerizable group.
2. The composition according to claim 1, wherein the third compound further includes a fourth polymerizable group.
3. The composition according to claim 1, further comprising:
a fourth compound that includes a bond cleaved by irradiation of the fourth compound.
4. The composition according to claim 1, wherein the second compound is a silane-coupling reagent.
5. The composition of claim 1, wherein
the first compound constitutes 0.01 wt %-10 wt % of the composition;
the second compound constitutes 0.1 wt %-50 wt % of the composition; and
the third compound constitutes 46 wt %-95.9 wt % of the composition.
6. The composition of claim 1, wherein the first compound is represented by Formula III.

7. A component, comprising:
an inorganic portion as a member; and
an organic portion formed by curing the composition of claim 1, wherein the composition further includes a first polymer containing an acidic group.

8. The component according to claim 7, wherein the organic portion includes a plurality of silicon atoms each of which is bonded to respective carbon atom(s).

9. The component according to claim 8, wherein each of the plurality of silicon atoms is bonded to an oxygen atom included in the inorganic portion.

10. The component according to claim 8, wherein each of the plurality of silicon atoms is covalently-bonded to an oxygen atom included in the inorganic portion.

11. A method for manufacturing a component, the method comprising:
providing a member;
disposing the composition of claim 1 on the member; and
curing the composition on the member.

12. The method according to claim 11, wherein:
the member includes an inorganic portion; and
disposing the composition is carried out such that the composition contacts the inorganic portion of the member before curing takes place.

13. The method according to claim 11, wherein the inorganic portion is constituted of silicon oxide or silicon.

14. A method for manufacturing a component, the method comprising:
disposing a composition onto a member, the composition comprising:
a first compound that includes an acidic group and a first polymerizable group; and
a second compound that includes a silicon atom, an oxygen atom bonded to the silicon atom, a hydrocarbon group bonded to the oxygen atom, and a second polymerizable group on the member; and
curing the composition on the member such that the composition is sandwiched between the member and a mold;
wherein the mold includes:
a first surface where a plurality of first portions and a plurality of second portions are formed; and
a second surface,
wherein a first distance between the plurality of first portions and the second surface is greater than a second distance between the plurality of second portions and the second surface so as to manufacture the component.

15. The method according to claim 14, wherein the first compound is represented by Formula II or Formula III,

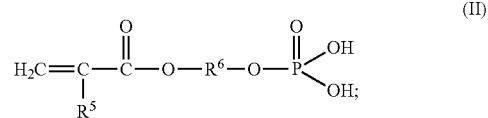

(II)

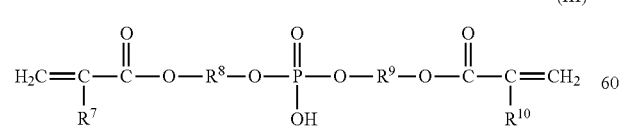

(III)

wherein
$R^5$ independently represents a hydrogen atom, a linear alkyl group, or a cyclic alkyl group,
$R^6$ independently represents a linear alkylene group or a cyclic alkylene group,
$R^7$ independently represents a hydrogen atom, a linear alkyl group, or a cyclic alkyl group,
$R^8$ independently represents a linear alkylene group or a cyclic alkylene group,
$R^9$ independently represents a linear alkylene group or a cyclic alkylene group, and
$R^{10}$ independently represents a hydrogen atom, a linear alkyl group, or a cyclic alkyl group; and
the second compound is represented by Formula I,

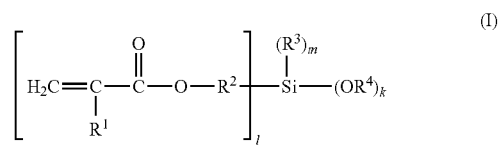

(I)

wherein $R^1$ independently represents a hydrogen atom, a linear alkyl group, or a cyclic alkyl group,
$R^2$ independently represents a linear alkylene group or a cyclic alkylene group,
$R^3$ independently represents an aryl group, a linear alkyl group, or a cyclic alkyl group,
$R^4$ independently represents an aryl group, a linear alkyl group, or a cyclic alkyl group,
k represents a natural number from one to three, and
m represents an integer from zero to two.

16. A method for manufacturing a component, the method comprising:
providing a member including an inorganic portion;
disposing the composition of claim 1 onto the inorganic portion of the member; and
curing the composition thereon.

17. A method for manufacturing a device, the method comprising:
curing the composition of claim 1 disposed onto a member so as to form the device.

18. The method according to claim 17, further comprising:
forming a first functional layer in the device in which a metal portion is formed.

19. The method according to claim 18, further comprising:
forming a second functional layer in the device in which a semiconductor film is formed.

20. The method according to claim 17, wherein the device is an electro-optical device.

21. The method according to claim 17, the method further comprising:
forming a first functional layer in the device in which a metal wire is formed; and
forming a second functional layer in the device in which a semiconductor film is formed, wherein the metal wire is electrically connected to the semiconductor film in the device.

* * * * *